United States Patent
Jin et al.

(10) Patent No.: US 8,223,523 B2
(45) Date of Patent: Jul. 17, 2012

(54) SEMICONDUCTOR APPARATUS AND CHIP SELECTION METHOD THEREOF

(75) Inventors: Sin Hyun Jin, Ichon-si (KR); Jong Chern Lee, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 386 days.

(21) Appl. No.: 12/650,507

(22) Filed: Dec. 30, 2009

(65) Prior Publication Data
US 2011/0102066 A1    May 5, 2011

(30) Foreign Application Priority Data
Oct. 29, 2009    (KR) .................. 10-2009-0103596

(51) Int. Cl.
*G11C 5/02*    (2006.01)
(52) U.S. Cl. ........ 365/51; 365/63; 365/230.06; 257/774; 257/777
(58) Field of Classification Search .................. None
See application file for complete search history.

(56) References Cited

U.S. PATENT DOCUMENTS

| | | | |
|---|---|---|---|
| 5,943,254 A * | 8/1999 | Bakeman et al. ................ 365/72 |
| 6,469,375 B2 * | 10/2002 | Beausoleil et al. ............ 257/686 |
| 6,624,506 B2 * | 9/2003 | Sasaki et al. .................. 257/686 |
| 6,740,981 B2 * | 5/2004 | Hosomi ......................... 257/778 |
| 7,111,149 B2 | 9/2006 | Eilert |
| 7,286,384 B2 * | 10/2007 | Wendt et al. ..................... 365/63 |
| 7,446,420 B1 * | 11/2008 | Kim ................................ 257/777 |
| 7,494,846 B2 * | 2/2009 | Hsu et al. ....................... 438/109 |
| 7,564,123 B1 | 7/2009 | Wang et al. |
| 7,598,617 B2 | 10/2009 | Lee et al. |
| 7,768,114 B2 * | 8/2010 | Choi .............................. 257/686 |
| 2005/0082664 A1 * | 4/2005 | Funaba et al. ................. 257/724 |
| 2009/0091962 A1 | 4/2009 | Chung et al. |
| 2009/0237970 A1 | 9/2009 | Chung |
| 2011/0102065 A1 * | 5/2011 | Jin et al. ........................ 327/524 |

FOREIGN PATENT DOCUMENTS
KR    100718038 B1    5/2007

\* cited by examiner

*Primary Examiner* — Alexander Sofocleous
(74) *Attorney, Agent, or Firm* — William Park & Associates Ltd.

(57) ABSTRACT

A semiconductor apparatus having a plurality of stacked chips includes: a through silicon via (TSV) configured to couple the plurality of chips together and configured to be coupled in series to a plurality of voltage drop units; a plurality of signal conversion units, each of which is configured to convert a voltage outputted from the voltage drop unit of the corresponding one of the plurality of chips to a digital code signal and provide the digital code signal as chip identification signal of the corresponding one of the plurality of chips; and a plurality of chip selection signal generating units, each of which is configured to compare the chip identification signal with a chip selection identification signal to generate a chip selection signal of the corresponding one of the plurality of chips.

11 Claims, 3 Drawing Sheets

US 8,223,523 B2

SEMICONDUCTOR APPARATUS AND CHIP SELECTION METHOD THEREOF

CROSS-REFERENCE TO RELATED APPLICATION

The present application claims priority under 35 U.S.C. §119(a) to Korean Application No. 10-2009-0103596, filed on Oct. 29, 2009, which is incorporated by reference in its entirety as if set forth in full.

BACKGROUND

1. Technical Field

Various aspects of the present disclosure generally relate to a semiconductor memory apparatus, and more particularly, to a semiconductor apparatus including a chip selection circuit.

2. Related Art

In an effort to increase an integration density of a semiconductor apparatus, a three-dimensional (3D) semiconductor apparatus that stacks and packages a plurality of chips into a single package is recently being developed. Since the 3D semiconductor apparatus includes multiple chips in a single device, the 3D semiconductor apparatus is configured such that an electrical signal can distinguish each of the plurality of chips from other chips and select a specific chip from the plurality of chips.

FIG. 1 is a diagram showing a configuration of semiconductor apparatus that comprises a related-art chip selection circuit. As shown in FIG. 1, three chips Chip1 Chip2 and Chip3 constituting the semiconductor apparatus are stacked one on top of another, but are not in exactly vertical alignment. Each of the chips Chip1 to Chip3 comprises separate chip selection pins (or pads) 1 and 2 to receive chip selection signals. Each of the chips Chip1 to Chip3 is applied with two voltages, e.g., an external voltage VDD and a ground voltage VSS through the two chip selection pins 1 and 2. Therefore, a specific chip can be selected from the three chips Chip1 to Chip3 based on the two voltages VDD and VSS applied. As shown in FIG. 1, since the related-art semiconductor apparatus includes the two chip selection pins 1 and 2, four chip selections are possible at the maximum.

However, since the related-art semiconductor apparatus is required to be equipped with separate chip selection pins as described, it is difficult to secure a surface area for the chip selection pins which strictly limits the number of available chip selections. In addition, since separate wire connections are needed to provide the voltages VDD and VSS to the chip selection pins, a complex wiring structure is necessary. Furthermore, according to the related art, since the chips are stacked in the vertically non-aligned pattern, a package structure is complicated and packaging the plurality of chips into the single package is difficult.

SUMMARY OF THE INVENTION

Accordingly, there is a need for an improved semiconductor memory apparatus and a related chip selection method that may overcome one or more of the problems discussed above. Therefore, various aspects of the present invention may provide a semiconductor apparatus and an associated chip selection method that are capable of generating chip selection signals by using a through silicon via (TSV).

To attain the advantages and in accordance with the purposes of the invention, as embodied and broadly described herein, one exemplary aspect of the invention may provide a semiconductor apparatus having a plurality of chips comprising: a through silicon via (TSV) configured to couple the plurality of chips together and configured to be coupled in series to a plurality of voltage drop units, wherein each of the plurality of voltage drop units is included in a corresponding one of the plurality of chips; a plurality of signal conversion units, each of which is disposed in the corresponding one of the plurality of chips and configured to convert a voltage outputted from the voltage drop unit of the corresponding one of the plurality of chips to a digital code signal and provide the digital code signal as a chip identification signal of the corresponding one of the plurality of chips; and a plurality of chip selection signal generating units, each of which is disposed in the corresponding one of the plurality of chips and configured to compare the chip identification signal with a chip selection identification signal to generate a chip selection signal of the corresponding one of the plurality of chips.

Another aspect of the invention may provide a chip selection method for a semiconductor apparatus having a plurality of chips comprising: applying each of a plurality of voltages having mutually different levels to a corresponding one of the plurality of chips by using a TSV, and assigning a chip identifier to the corresponding one of the plurality of chips; and selecting a chip which is assigned with the chip identifier that matches a chip selection identifier.

BRIEF DESCRIPTION OF THE DRAWINGS

The accompanying drawings, which are incorporated in and constitute a part of this specification, illustrate various aspects consistent with the invention and, together with the description, serve to explain the principles of the invention.

DETAILED DESCRIPTION OF THE PREFERRED EMBODIMENTS

Hereinafter, a semiconductor apparatus and a chip selection method thereof, according to the present invention, will be described below with reference to the accompanying drawings through preferred embodiments.

Figure 1:
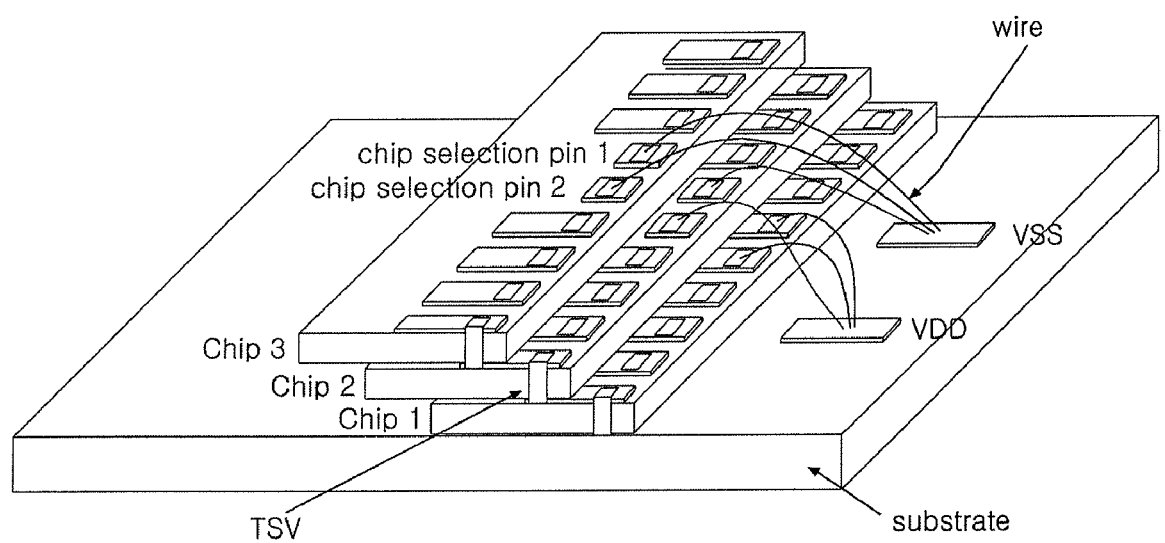
FIG. 1 is a diagram showing a configuration of a semiconductor apparatus that comprises a related-art chip selection circuit.
Figure 2:
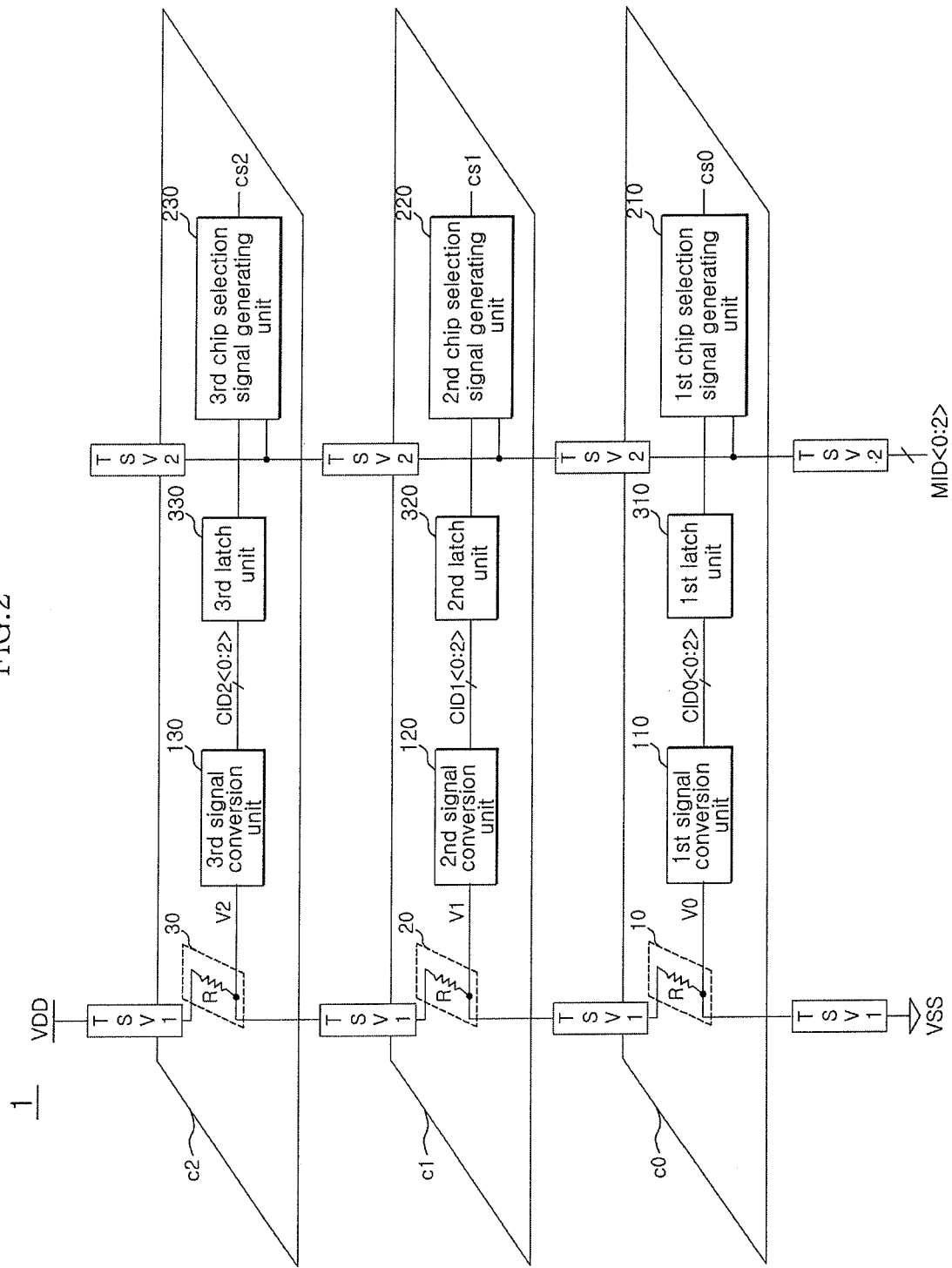
FIG. 2 is a block diagram schematically showing configuration of a semiconductor apparatus according to the embodiment of the invention.

FIG. 2 is a block diagram schematically showing a configuration of a semiconductor apparatus according to an embodiment of the invention. As shown in FIG. 2, first to third chips c0 to c2 are stacked one on top of another in vertical alignment, and are coupled to each other via a plurality of through silicon vias (TSVs), which constitute the semiconductor apparatus 1. FIG. 2 illustrates a structure of three stacked chips, although the invention is not limited to the specific embodiment. In addition, first and second TSVs TSV1 and TSV2 are shown for the purpose of describing the operation of the semiconductor apparatus 1 in FIG. 2. The first and second TSVs TSV1 and TSV2 penetrate and couple the first to third chips c0 to c2 together.

Each of the first to third chips c0 to c2 includes first to third voltage drop units 10 to 30, respectively. The respective voltage drop units 10 to 30 are coupled in series to the first TSV TSV1. The first TSV TSV1 receives an external voltage VDD through its first terminal, and receives a ground voltage VSS through its second terminal, respectively. Therefore, since the respective voltage drop units 10 to 30 are coupled in series to the first TSV TSV1, a plurality of voltages having mutually different levels can be respectively provided to the first to third chips c0 to c2.

The external voltage VDD applied to the first terminal of the first TSV TSV1 is sequentially decreased as the external voltage VDD passes through the voltage drop units 10 to 30. Therefore, among first to third voltages V0 to V2, the third voltage V2 outputted from the voltage drop unit 30 of the third chip c2 has the highest level, the second voltage V1 outputted from the voltage drop unit 20 of the second chip c1 has the second highest level, and the first voltage V0 outputted from the voltage drop unit 10 of the first chip c0 has the lowest level. Alternatively, the first to third voltages V0 to V2 having levels in a sequentially decreasing order may also be respectively provided to the first to third chips c0 to c2.

The respective voltage drop units 10 to 30 can be implemented with conventional resistance elements Rs. The resistance value of each of the resistance elements Rs can be varied in various ways based on the number of stacked chips.

Each of the first to third voltages V0 to V2 outputted from the voltage drop units 10 to 30 of the first to third chips c0 to c2 are respectively inputted to first to third signal conversion units 110 to 130, which are included respectively in the first to third chips c0 to c2. In particular, the first signal conversion unit 110 receives the first voltage V0 outputted from the voltage drop unit 10 of the first chip c0, the second signal conversion unit 120 receives the second voltage V1 outputted from the voltage drop unit 20 of the second chip c1, and the third signal conversion unit 130 receives the third voltage V2 outputted from the voltage drop unit 30 of the third chip c2.

The first to third signal conversion units 110 to 130 respectively receive the first to third voltages V0 to V2 as analogue values, and respectively convert the first to third voltages V0 to V2 to digital code signals. Therefore, each of the first to third signal conversion units 110 to 130 can be implemented with an analog-to-digital converter (ADC) which converts an analog voltage to a digital code signal. Hereinafter, each of the first to third signal conversion units 110 to 130 is exemplified as an analog-to-digital converter (ADC) that receives the analog voltage to generate a 3-bit digital code signal.

As described above, since third voltage V2 outputted from the third voltage drop unit 30 of the third chip c2 has the highest level, and thus the third signal conversion unit 130 can receive the third voltage V2 to output a bit-wise signal of, for example, "1, 0, 0" as a digital code signal. Also, the second voltage V1 outputted from the second voltage drop unit 20 of the second chip c1 has the second highest level, and thus the second signal conversion unit 120 can receive the second voltage V1 to output a bit-wise signal of, for example, "0, 1, 0" as the digital code signal. Furthermore, the first voltage V0 outputted from the first voltage drop unit 10 of the first chip c0 has the lowest level, and thus the first signal conversion unit 110 can receive the first voltage V0 to output a bit-wise signal of, for example, "0, 0, 1" as the digital code signal.

The plurality of digital code signals are chip identification signals that respectively function as individual identification (ID) signals CID0<0:2> to CID2<0:2> of the first to third chips c0 to c2 each of which serves to identify the corresponding chip in the plurality of chips. That is, the digital code signal "1, 0, 0" can be assigned to the third chip c2 as the individual ID signal CID2<0:2>, the digital code signal "0, 1, 0" can be assigned to the second chip c1 as the individual ID signal CID1<0:2>, and the digital code signal "0, 0, 1" can be assigned to the first chip c0 as the individual ID signal CID0<0:2>.

In the embodiment, it is exemplified that the three chips c0 to c2 are stacked, and each of the ADCs is configured to generate the 3-bit digital code signal, which makes only a total of eight chip selections available. However, it will be apparent to those skilled in the art that, in case where more voltage drop units and more ADCs are included and each of the ADC generates digital code signal having more bits, any number of individual IDs can be generated and assigned to a plurality of chips, with only a single TSV.

The semiconductor apparatus 1 can further include first to third latch units 310 to 330 which are respectively disposed in the first to third chips c0 to c2 and latch the individual ID signals CID0<0:2> to CID2<0:2> generated from the first to third signal conversion units 110 to 130, respectively. That is, the individual ID signals CID0<0:2> to CID2<0:2> can be respectively latched in the first to third latch units 310 to 330.

The individual ID signals CID0<0:2> to CID2<0:2> are respectively inputted to the first to third chip selection signal generating units 210 to 230. The first to third chip selection signal generating units 210 to 230 are respectively disposed in the first to third chips c0 to c2. The first chip selection signal generating unit 210 receives the individual ID signal CID0<0:2> of the first chip c0 and a main ID signal MID<0:2> to generate a first chip selection signal cs0 which enables the first chip c0. Similarly, the second chip selection signal generating unit 220 receives the individual ID signal CID1<0:2> of the second chip c1 and the main ID signal MID<0:2> to generate the second chip selection signal cs1 which enables the second chip c1, and the third chip selection signal generating unit 230 receives the individual ID signal CID2<0:2> of the third chip c2 and the main ID signal MID<0:2> to generate the third chip selection signal cs2 which enables the third chip c2.

Each of the first to third chip selection signal generating units 210 to 230 is respectively configured to generate its own chip selection signal among the first to third chip selection signals cs0 to cs2 when the individual ID signal CIDi<0:2> of its own matches the main ID signal MID<0:2>.

The main ID signal MID<0:2>, which functions as a chip selection identification signal, is a command signal that identifies a chip to be selected among the plurality of chips c0 to c2. The main ID signal MID<0:2> can be inputted, e.g., from outside of the semiconductor apparatus 1. For example, the main ID signal MID<0:2> can be inputted from a controller, coupled to the semiconductor apparatus 1, in order to select a chip that should operate, among the plurality of chips included in the semiconductor apparatus 1. The main ID signal MID<0:2> as shown in FIG. 2, can be transmitted to the respective first to third chip selection signal generating units 210 to 230 via the second TSV TSV2 penetrating the first to third chips c0 to c2.

The reason that each of the first to third chips c0 to c2 has its own voltage drop units 10 to 30, the latch units 310 to 330 and the chip selection signal generating units 210 to 230 disposed therein, respectively will be explained below. In a 3D semiconductor apparatus having a plurality of stacked chips, each chip's configuration is very important. Varied configuration across the plurality of stacked chips requires separate masking on the respective chips, which will increase the manufacturing cost of the semiconductor apparatus. However, the semiconductor apparatus 1 according to the embodiment facilitates substantially the same configuration across the whole component chips through disposing substantially the same circuit in each of the plurality of chips. This will help reduce the manufacturing cost of the semiconductor apparatus.

Figure 3:
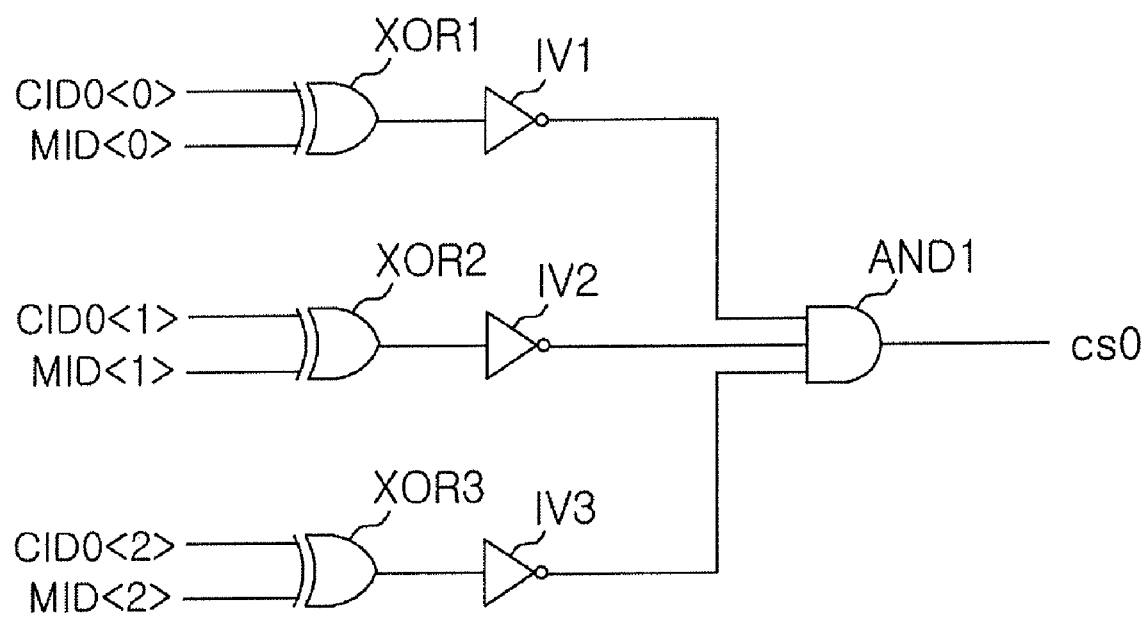
FIG. 3 is a diagram showing a configuration of an embodiment of a first chip selection signal generating unit in FIG. 2.

FIG. 3 is a diagram showing a configuration of an embodiment of the first chip selection signal generating unit 210 in FIG. 2. As shown in FIG. 4, the first chip selection signal generating unit 210 comprises first to third XOR gates XOR1 to XOR3, first to third inverters IV1 to IV3, and a first AND gate AND1. The first XOR gate XOR1 receives the first bit CID0<0> of the individual ID signal CID0<0:2> of the first chip c0 and the first bit MID<0> of the main ID signal MID<0:2>. Similarly, the second XOR gate XOR2 receives the second bit CID0<1> of the individual ID signal CID0<0:2> of the first chip c0 and the second bit MID<1> of the main ID signal MID<0:2>, and the third XOR gate XOR3 receives the third bit CID0<2> of the individual ID signal CID0<0:2> of the first chip c0 and the third bit MID<2> of the main ID signal MID<0:2>. The first to third XOR gates XOR1 to XOR3 respectively output a logic low level signal when the bits of the received individual ID signal CID0<0:2> respectively match the corresponding bits of the received main ID signal MID<0:2>. The first to third inverters IV1 to IV3 invert outputs of the first to third XOR gates XOR1 to XOR3, respectively. The first AND gate AND1 receives outputs of the first to third inverters IV1 to IV3 to generate the first chip selection signal cs0. Therefore, the first chip selection signal generating unit 210 enables the first chip selection signal cs0 only when all of the bits of the received individual ID signal CID0<0:2> match the corresponding bits of the received main ID signal MID<0:2>. Here, the second and third chip selection signal generating units 220 and 230 have substantially the same configuration and function as the first chip selection signal generating unit 210.

An operation of the semiconductor apparatus 1 will now be described with reference to FIGS. 2 and 3. The first to third voltages V0 to V2 which have levels in a sequentially increasing order, are respectively provided to the first to third chips c0 to c2 through the voltage drop units 10 to 30 included in the first to third chips c0 to c2. The first to third signal conversion units 110 to 130 respectively receive the first to third analog voltages V0 to V2 and respectively generate the 3-bit digital code signals which have logic levels different from each other, based on the received voltage levels. For example, the third signal conversion unit 130 receives the third analog voltage V2 to generate the digital code signal "1, 0, 0", the second signal conversion unit 120 receives the second analog voltage V1 to generate the digital code signal "0, 1, 0", and the first signal conversion unit 110 receives the first analog voltage V0 to generate the digital code signal "0, 0, 1". Thereafter, the plurality of digital code signals "1, 0, 0", "0, 1, 0", "0, 0, 1" respectively function as the individual ID signals CID0<0:2> to CID2<0:2> of the first to third chips c0 to c2.

Here, if a digital code signal is applied as the main ID signal MID<0:2> via the TSV TSV2, only a single chip that has an individual ID signal which matches the main ID signal MID<0:2> may be selected and enabled. For example, if a digital code signal "1, 0, 0" is applied as the main ID signal MID<0:2>, the third chip selection signal generating unit 230 receiving the digital code signal "1, 0, 0" as the individual ID signal CID2<0:2> enables the third chip selection signal cs2 because all the respective bits of the digital code signal "1, 0, 0" as the individual ID signal CID2<0:2> match the corresponding bits of the main ID signal MID<0:2>. In this case, however, the first and second chip selection signal generating units 210 and 220 respectively disable the first and second chip selection signals cs0 and cs1 because neither of the first and second individual ID signals CID0<0:2> and CID1<0:2> match the main ID signal MID<0:2>. Consequently, if a main ID signal MID<0:2> having the digital code signal "1, 0, 0" is applied, only the third chip selection signal cs2 among the first to third chip selection signals cs0 and cs2 can be enabled, and thus, only the third chip c2 among the first to third chips c0 to c2 can be selected and enabled.

As a result, the semiconductor apparatus 1 according to the embodiment includes the plurality of voltage drop units coupled in series to the single. TSV, and can assign the mutually different individual IDs to each of the plurality of vertically stacked chips. Therefore, according to the embodiment, it is unnecessary for the semiconductor apparatus 1 to stack the plurality of chips in the vertically non-aligned pattern and include the separate chip selection pads, thereby making it easy to secure the surface area of the chips constituting the semiconductor apparatus and simplifying the package structure.

In addition, according to the embodiment, it is unnecessary to provide separate wires for receiving the chip selection signals, thereby simplifying the wiring structure.

While certain aspects and/or embodiments of the invention have been described above, it will be understood to those skilled in the art that the aspects/embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A semiconductor apparatus having a plurality of chips, comprising:
   a through silicon via (TSV) configured to couple the plurality of chips together and configured to be coupled in series to a plurality of voltage drop units, wherein each of the plurality of voltage drop units is included in a corresponding one of the plurality of chips;
   a plurality of signal conversion units, each of which is disposed in the corresponding one of the plurality of chips and configured to convert a voltage outputted from the voltage drop unit of the corresponding one of the plurality of chips to a digital code signal and provide the digital code signal as a chip identification signal of the corresponding one of the plurality of chips; and
   a plurality of chip selection signal generating units, each of which is disposed in the corresponding one of the plurality of chips and configured to compare the chip identification signal with a chip selection identification signal to generate a chip selection signal of the corresponding one of the plurality of chips.

2. The semiconductor apparatus of claim 1, wherein each of the voltage drop units is configured to include a resistance element.

3. The semiconductor apparatus of claim 1, wherein each of the plurality of signal conversion units includes an analog-to-digital converter (ADC) configured to receive the voltage outputted from the voltage drop unit to generate the chip identification signal.

4. The semiconductor apparatus of claim 1, wherein each of the plurality of chip selection signal generating units is configured to enable the chip selection signal if the chip identification signal matches the chip selection identification signal.

5. The semiconductor apparatus of claim 1, wherein the semiconductor apparatus further includes a plurality of latch units,
   wherein each of the plurality of latch units is disposed in the corresponding one of the plurality of chips and latch the chip identification signal.

6. The semiconductor apparatus of claim 1, wherein the chip selection identification signal is a command signal inputted from outside of the semiconductor apparatus.

7. The semiconductor apparatus of claim 1, wherein the chip selection identification signal is transmitted to each of the plurality of chip selection signal generating units via another TSV.

8. A chip selection method for a semiconductor apparatus having a plurality of chips, comprising:
- applying an input voltage from a through silicon via (TSV) to a series coupled voltage drop unit of a corresponding one of the plurality of chips;
- outputting an output voltage from the series coupled voltage drop unit to a signal conversion unit of the corresponding one of the plurality of chips;
- converting the output voltage to a digital code; and
- assigning a chip identifier to the corresponding one of the plurality of chips based upon the digital code; and
- comparing the chip identifier with a chip selection identifier to generate a chip selection signal of the corresponding one of the plurality of chips.

9. The chip selection method of claim 8, comprising:
storing the chip identifier.

10. The chip selection method of claim 8, wherein the chip selection identifier is a command inputted from outside of the semiconductor apparatus.

11. The chip selection method of claim 8, wherein the chip selection identifier is transferred to each of the plurality of chips via another TSV.

* * * * *